US011243573B2

(12) United States Patent
Hsu et al.

(10) Patent No.: US 11,243,573 B2
(45) Date of Patent: Feb. 8, 2022

(54) SEMICONDUCTOR PACKAGE, DISPLAY APPARATUS AND MANUFACTURING METHOD OF SEMICONDUCTOR PACKAGE

(71) Applicant: Taiwan Semiconductor Manufacturing Co., Ltd., Hsinchu (TW)

(72) Inventors: Cheng-Tung Hsu, Taoyuan (TW); Chang-Cheng Hung, Hsinchu County (TW); Tyrone Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 98 days.

(21) Appl. No.: 16/860,068

(22) Filed: Apr. 28, 2020

(65) Prior Publication Data

US 2021/0333834 A1   Oct. 28, 2021

(51) Int. Cl.
*H05K 7/00* (2006.01)
*G06F 1/16* (2006.01)
*G09G 3/20* (2006.01)
*G06F 1/18* (2006.01)
*G09F 9/30* (2006.01)

(52) U.S. Cl.
CPC ............ *G06F 1/1652* (2013.01); *G06F 1/189* (2013.01); *G09F 9/301* (2013.01); *G09G 3/20* (2013.01); *G09G 2300/0426* (2013.01); *G09G 2380/02* (2013.01)

(58) Field of Classification Search
CPC ......... G06F 1/1652; G06F 1/189; G09G 3/20; G09G 2300/0426; G09G 2380/02; G09F 9/301
See application file for complete search history.

(56) References Cited

U.S. PATENT DOCUMENTS

| | | |
|---|---|---|
| 8,987,922 B2 | 3/2015 | Yu et al. |
| 9,196,532 B2 | 11/2015 | Tu et al. |
| 9,196,559 B2 | 11/2015 | Tsai et al. |
| 9,257,333 B2 | 2/2016 | Lu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,372,206 B2 | 6/2016 | Wu et al. |
| 9,496,189 B2 | 11/2016 | Yu et al. |
| 2002/0048930 A1* | 4/2002 | Lin ..................... H01L 23/5222 438/622 |

(Continued)

*Primary Examiner* — Joe H Cheng
(74) *Attorney, Agent, or Firm* — JCIPRNET

(57) ABSTRACT

A semiconductor package includes a flexible substrate and a semiconductor device. The flexible substrate includes a device bonding region and a device top metallization structure including a plurality of device signal lines and a plurality of device power lines extended beyond the device bonding region. The semiconductor device is disposed on the device bonding region and includes an interconnecting metallization structure and a passivation layer covering the interconnecting metallization structure and revealing a plurality of interconnect contacts of the interconnecting metallization structure, wherein the plurality of interconnect contacts electrically connected to one another through the device top metallization structure.

20 Claims, 4 Drawing Sheets

(56) References Cited

U.S. PATENT DOCUMENTS

| | | | | |
|---|---|---|---|---|
| 2005/0017355 | A1* | 1/2005 | Chou | H01L 24/05 |
| | | | | 257/738 |
| 2006/0244156 | A1* | 11/2006 | Cheng | H01L 24/05 |
| | | | | 257/784 |
| 2008/0001296 | A1* | 1/2008 | Tu | H01L 24/05 |
| | | | | 257/762 |
| 2008/0081457 | A1* | 4/2008 | Lin | H01L 23/5283 |
| | | | | 438/614 |
| 2010/0201000 | A1* | 8/2010 | Antol | H01L 23/528 |
| | | | | 257/776 |
| 2010/0244239 | A1* | 9/2010 | Bao | H01L 24/05 |
| | | | | 257/737 |
| 2010/0246152 | A1* | 9/2010 | Lin | H01L 25/18 |
| | | | | 361/783 |
| 2011/0079897 | A1* | 4/2011 | Park | H01L 23/49816 |
| | | | | 257/737 |
| 2021/0225780 | A1* | 7/2021 | Wu | H01L 21/6835 |

* cited by examiner

SEMICONDUCTOR PACKAGE, DISPLAY APPARATUS AND MANUFACTURING METHOD OF SEMICONDUCTOR PACKAGE

BACKGROUND

An electro-optical apparatus used as a display of electronic devices such as a mobile phone may include the following components. An electro-optical panel has an image display section using liquid crystal or the like as electro-optical material and being constituted of a plurality of picture elements. A drive circuit unit includes electronic components required for driving the image display section. A flexible printed circuit (hereinafter, referred to as FPC) board is configured for connecting electro-optical panel and electronic equipment body. A light source unit includes a light source emitting a light beam and a light guide plate or the like for guiding a light beam emitted from the light source to the image display section.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
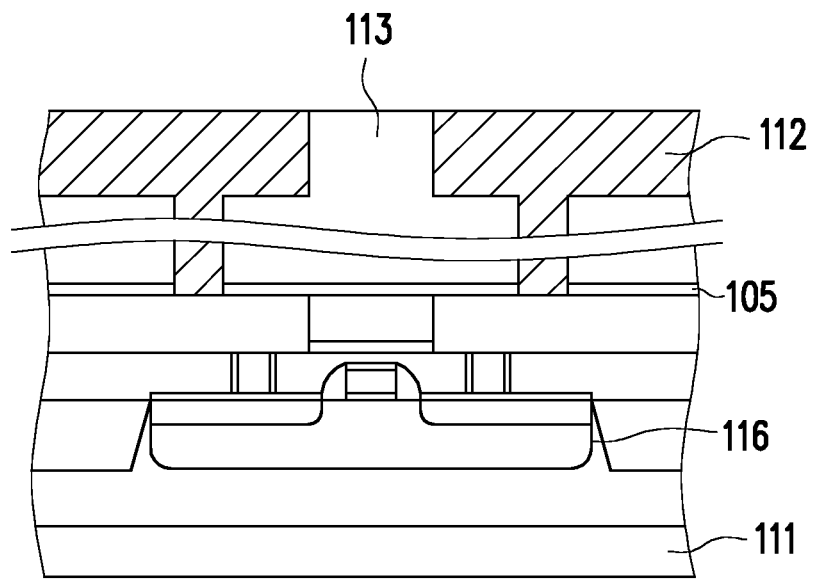
FIG. 1 to FIG. 4 illustrate cross sectional views of an intermediate stage in a manufacturing of a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 to FIG. 4 illustrate cross sectional views of an intermediate stage in a manufacturing of a semiconductor package according to some exemplary embodiments of the present disclosure. One of the exemplary embodiments of method for manufacturing a semiconductor package 100 is provided in the following description. In some embodiments, a semiconductor device (the semiconductor device 110 shown in FIG. 3, for example) is provided. The method of forming such semiconductor device may include the following steps. With reference to FIG. 1, in some embodiments, a plurality of devices 116 may be formed in and on a semiconductor substrate 111. In some exemplary embodiments, the devices 116 may be formed in one or more dielectric layers 113. For example, the devices 116 may include various N-type metal-oxide semiconductor (NMOS) and/or P-type metal-oxide semiconductor (PMOS) devices, such as transistors, capacitors, resistors, diodes, photo-diodes, fuses, and the like. The devices 116 may be electrically connected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry or devices may be used as appropriate for a given application.

In accordance with some embodiments of the disclosure, an interconnecting metallization structure 112 is formed on the semiconductor substrate 111. In some exemplary embodiments, a plurality of metal layers are formed in one or more layers of integrated circuit (IC) interconnection, above the device layer 116. These metal layers are referred to as an interconnecting metallization structure 112. In general, inter-metal dielectric (IMD) layers 113 formed in the metallization layers of the interconnecting metallization structure 112 are usually formed of low-k dielectric materials. In some embodiments, the dielectric layers 113 may include silicon-based oxides, such as chemical vapor deposited (CVD) silicon oxide, CVD TEOS oxide, spin-on-glass (SOG), fluorosilicate glass (FSG), high density plasma CVD oxides, or the composite layer formed by a portion of this group of materials. In some embodiments, the interconnecting metallization structure 112 is typically formed by sputtering aluminum or an aluminum alloy and patterning the aluminum to form the fine metal lines. In an alternative embodiment, the interconnecting metallization structure 112 may be formed by a copper damascene process. In the copper damascene process, the copper is protected by an adhesion/barrier layer not only underlying the copper, but also surrounding the copper at the sidewalls of the line in order to prevent the migration of copper ions through the IMD which could adversely affect the underlying active devices. In accordance with some embodiments of the disclosure, the fine lines of the interconnecting metallization structure 112 typically have a thickness of between about 1000 and 10,000 Angstroms, but the disclosure is not limited thereto. In some exemplary embodiments, in the fabrication process of the interconnecting metallization structure 112, a clean room environment of class ≤10 is typically adapted. That is, no more than 10 particles larger than 0.5 microns are found in any given cubic foot of air. In some exemplary embodiments, the interconnecting metallization structure 112 may be fabricated by a photoresist layer.

Figure 2:
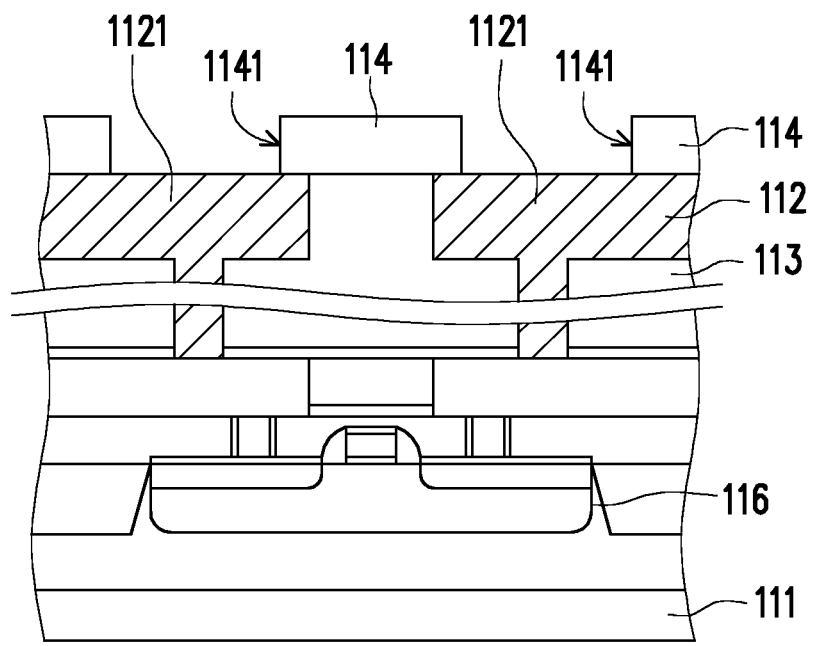

With now reference to FIG. 2, in accordance with some embodiments of the disclosure, a passivation layer 114 may be formed on the topmost layer of the interconnecting metallization structure 112, and the topmost layer of the interconnecting metallization structure 112 may include a plurality of interconnect contacts 1121. Herein, two interconnect contacts 1121 are illustrated in the partial cross sectional view of FIG. 2, but one of ordinary skills in the art should understands that more than two interconnect contacts may be provided in the semiconductor device. The disclosure is not limited thereto. In some embodiments, an etch stop layer 105 may be formed between the dielectric layers 113. In the preferred embodiment, passivation layer 114 is formed of a non-organic material selected from un-doped silicate glass (USG), silicon nitride, silicon oxynitride, silicon oxide, and combinations thereof. In some embodiments, the passivation layer 114 covers the interconnecting metallization structure 112, while providing openings 1141 for revealing the interconnect contacts 1121. In some embodiments, the passivation layer 114 may be formed by plasma enhanced chemical vapor deposition (PECVD) oxide and nitride. In creating the passivation layer 114, a layer of PECVD oxide is deposited first followed by a layer of nitride, but the disclosure is not limited thereto. In addition to PECVD oxide and PECVD nitride, the passivation layer 114 may also be formed of silicon oxynitride, phosphosilicate glass (PSG), borosilicate glass (BSG), borophosphosilicate glass (BPSG), or combinations thereof. In some other embodiments, the passivation layer 114 is formed of a dielectric material, such as undoped silicate glass (USG), silicon nitride, silicon oxide, silicon oxynitride or a non-porous material by any suitable method, such as chemical vapor deposition (CVD), physical vapor deposition (PVD), or the like. In one of the embodiment, the passivation layer 114 is formed to cover a peripheral portion of each interconnect contacts 1121, and to expose a central portion of each interconnect contacts 1121 through the openings 1141 in the passivation layer 114. In other embodiments, the passivation layer 114 may be, for example, a polymer layer, which is patterned to form openings 1141, through which the interconnect contacts 1121 are exposed. In some embodiments, the polymer layer is formed of a polymer material such as an epoxy, polyimide, benzocyclobutene (BCB), polybenzoxazole (PBO), or the like, although other relatively soft, often organic, dielectric materials can also be used. The formation methods include spin coating or other methods. In some embodiments, the passivation layer 114 may be a single layer or a laminated layer, and may be configured to protect the semiconductor device from moisture and foreign ion contamination.

Figure 3:
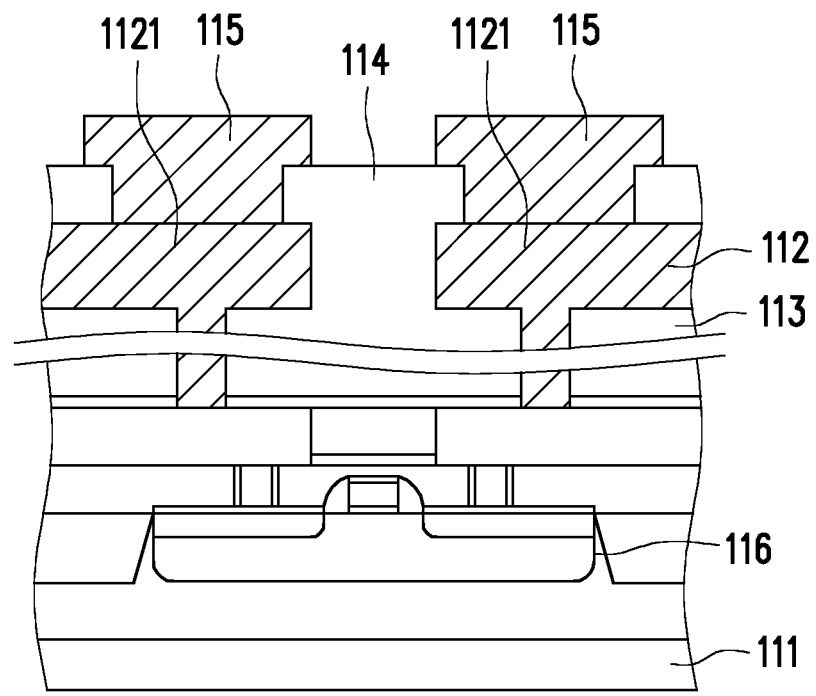

With now reference to FIG. 3, in accordance with some embodiments of the disclosure, a plurality of conductive bumps 115 are formed on the interconnect contacts 1121 respectively. Herein, two conductive bumps 115 are illustrated in the partial cross sectional view of FIG. 3, but one of ordinary skills in the art should understands that more than two conductive bumps 115 may be provided in the semiconductor device 110. The number of the conductive bumps 115 may be corresponding to the number of the interconnect contacts. The disclosure is not limited thereto. In some embodiments, the conductive bumps 115 may be a spherical bump or a pillar bump formed of a conductive material including at least one of solder, Cu, Ni or Au. In one of the embodiments, each of the conductive bumps 115 may be a solder bumps formed by attaching a solder ball to the interconnect contacts 1121 and then thermally reflowing the solder material. In an embodiment, each of the conductive bumps 115 may be formed by plating a solder layer using photolithography technologies followed by reflow processes. In some embodiments, each of the conductive bumps 115 may include a lead-free pre-solder layer, SnAg, or a solder material including alloys of tin, lead, silver, copper, nickel, bismuth, or combinations thereof. At the point, the manufacturing method of the semiconductor device 110 may be substantially completed.

Figure 4:
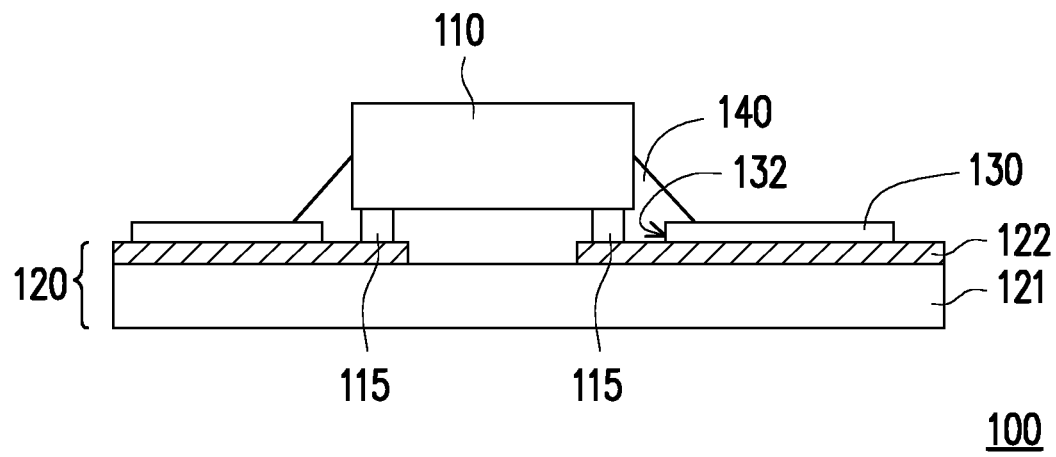

With now reference to FIG. 4, in accordance with some embodiments of the disclosure, the semiconductor device 110 is bonded on a device bonding region R1 of a flexible substrate 120. In some embodiments, the flexible substrate 120 includes a device top metallization structure 122, which is disposed on the device bonding region R1 and extended beyond the device bonding region R1. In some embodiments, the semiconductor device 110 is bonded to the device top metallization structure 122 through the conductive bumps 115. In some embodiments, the interconnect contacts 1121 are electrically connected to one another through the device top metallization structure 122. In some embodiments, flexible substrate 120 may further include a base film 121, which may be made of an insulating material such as, but not limited to, polyimide (PI), which may include a condensation product of an acid anhydride, a diamine compound, etc. The semiconductor device 110 may be mounted on the device bonding region R1 by surface mount technology (SMT) and electrically connected to the device top metallization structure 122.

In some embodiments, a protection layer 130 may be formed on the flexible substrate 120. In some embodiments, the protection layer 130 may be a dry photoresist mask (referred to as a solder mask or a solder resist layer), but the disclosure is not limited thereto. In some embodiments, the protection layer 130 can be patterned to expose an underlying metal pattern. For example, as illustrated, the protection layer 130 is patterned, using a photolithography process, to define an opening 132 that configured for exposing a part of the device top metallization structure 122 where the semiconductor device 110 is mounted. In other words, the protection layer 130 partially covers the device top metallization structure 122 and reveals the device bonding region R1.

In some embodiments, after the bonding process, an underfill material 140 may be formed between the semiconductor device 110 and the flexible substrate 120. For example, the underfill material 140 may be filled into the gaps between the semiconductor device 110 and the flexible substrate 120. In one of the implementations, the underfill material 140 may be applied using a dispensing needle. The underfill material 140 may include an epoxy or polymer including a liquid when applied that flows beneath the semiconductor device 110 and between the conductive bumps 115. In some embodiments, the underfill material 140 is then cured using heat to form a solid underfill material 140. In an alternative embodiments, the underfill material 140 may include other materials and may be applied and cured using other methods. In some embodiments, the underfill material 140 covers the device top metallization structure 122 revealed by the opening 132 of the protection layer 130. In some embodiments, the underfill material 140 may be further filled between a side surface of the semiconductor device 110 and a side surface of the protection layer 130 as shown in FIG. 4. At the time, a manufacturing process of the semiconductor package 100 may be substantially completed.

Generally speaking, the devices (e.g. the device 116, but not limited thereto) formed in or on the semiconductor substrate 111 may be electrically connected to one another to form operational circuits through the topmost metallization layer (top metal), which is formed on the passivation layer 114. That is to say, the topmost metallization layer may include metal points of electrical contacts (such as bond pads), which provide connections from the interconnecting metallization structure 112 to outside of the semiconductor device 110. The topmost metallization layer further include surrounding circuitry such as power lines, ground lines and/or signal lines, which these metal points of electrical contacts are connected to, for external power, ground and signal distribution. Accordingly, through the connection of the power lines, ground lines and/or signal lines, some of the interconnect contacts (e.g. interconnect contacts 1121, but not limited thereto) may be combined into (connected to) one electrical contacts. That is to say, the number of the electrical contacts of the topmost metallization layer may be substantially less than the number of the interconnect contacts of the interconnecting metallization structure 112. With such configuration, the conductive bumps 115 are formed on the electrical contacts of topmost metallization layer.

In the present embodiment, the semiconductor device 110 is free of the topmost metallization layer (top metal) that are electrically connected to the interconnect contacts (e.g. interconnect contacts 1121, but not limited thereto). Specifically, the semiconductor device 110 is free of the (topmost) power lines and the (topmost) signal lines at the topmost layer for electrically connecting the interconnect contacts (e.g. interconnect contacts 1121, but not limited thereto) to one another. Accordingly, some of the interconnect contacts (e.g. interconnect contacts 1121, but not limited thereto) may not be electrically connected to one another. For example, the interconnect contacts 1121 may be electrically connected to different devices formed in or on the semiconductor substrate 111, and may not be electrically connected to one another. Instead, the interconnect contacts 1121 are electrically connected to one another through the topmost metallization layer of the flexible substrate (e.g. the flexible substrate 120 shown in FIG. 4), that is to be bonded to the semiconductor device 110. That is to say, in the present embodiment, the topmost metallization layer (top metal) of the semiconductor device 110 is omitted for cost reduction. In other words, the semiconductor device 110 is free of the topmost metallization layer (top metal). In one of the implementations, the interconnecting metallization structure 112 is free of device power lines and device signal lines, which are configured for electrically connecting the interconnect contacts 1121 to one another. Accordingly, the top metallization structure of the flexible substrate 120 is re-designed to include the device top metallization structure 122, that is supposed to be on the semiconductor device 110, for electrically connecting the interconnect contacts 1121 to one another. Thereby, the production cost and overall thickness of the semiconductor device 110 can be reduced.

With such configuration, the interconnecting metallization structure 112 of the semiconductor device 110 is at fine metal level since the top metal, which is at the wide metal level, is omitted. Accordingly, the interconnect contacts 1121 are at the micro and sub-micro level. Therefore, semiconductor device 110 is easier and more cost effectively to manufacture.

Figure 5:
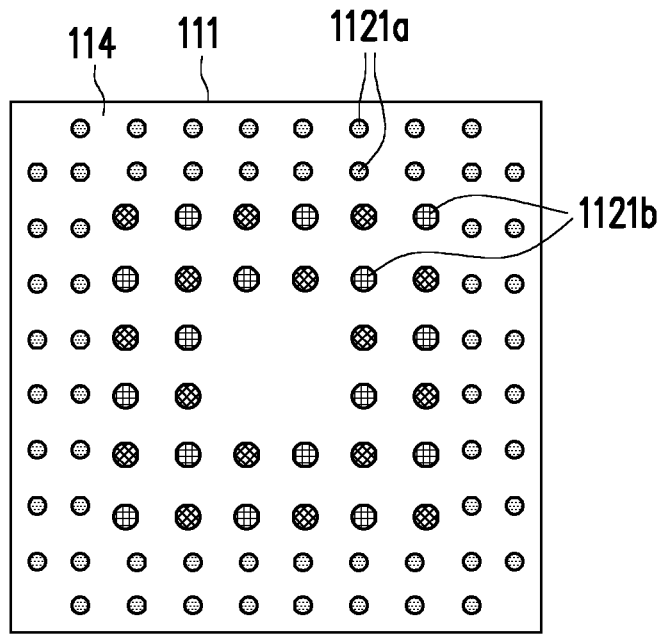
FIG. 5 illustrates a bottom view of a semiconductor device according to some exemplary embodiments of the present disclosure.
Figure 6:
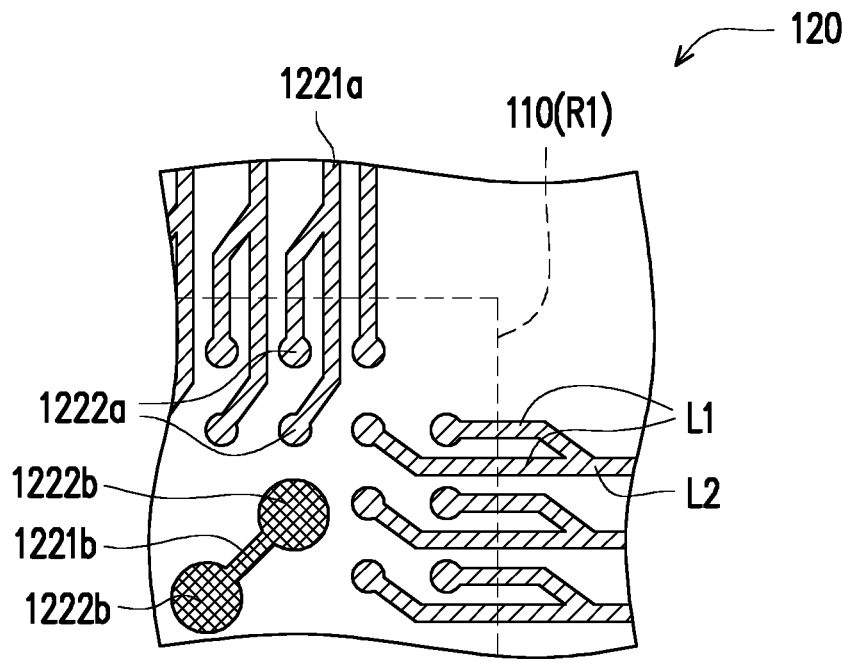
FIG. 6 illustrates a partial enlarged view of a semiconductor package according to some exemplary embodiments of the present disclosure.

FIG. 5 illustrates a bottom view of a semiconductor device according to some exemplary embodiments of the present disclosure. FIG. 6 illustrates a partial enlarged view of a semiconductor package according to some exemplary embodiments of the present disclosure. With now reference to FIG. 5 and FIG. 6, in accordance with some embodiments of the disclosure, the interconnect contacts 1121 on the semiconductor device 110 may include a plurality of interconnect signal pads (i.e., input/output pads) 1121a and a plurality of interconnect power pads (and/or ground pads) 1121b. It is to be noted that the interconnect power and/or ground pads 1121b may be heavier and larger in design relative to the interconnect signal pads 1121a. The disclosure is not limited thereto. In some embodiments, the interconnect signal pads 1121a on the semiconductor device 110 are arranged in an area array substantially covering a bonding surface of the semiconductor device 110, as shown by way of illustration in a plan view generally in FIG. 5. The interconnect signal pads 1121a and the interconnect power/ground pads 1121b directed respectively to the signal, power and ground functions of the semiconductor device 110, are distributed throughout the multiple rows and columns within the array.

In some of the embodiments, the interconnect signal pads (e.g., the interconnect signal pads 1121a) are, in this example, arranged on the bonding surface near the perimeter of the semiconductor device 110, in rows parallel to the outer edges of the semiconductor device 110. In one of the embodiments, the interconnect signal pads 1121a are arranged in a generally orthogonal array of multiple rows (two rows are illustrated in the embodiment of FIG. 5, but not limited thereto) parallel to the outer edges of the semiconductor device 110. In an alternative embodiment, the interconnect signal pads 1121a may be arranged in a staggered perimeter array of multiple rows parallel to the outer edges of the semiconductor device 110. In some embodiments, the interconnect signal pads 1121a in each row may have about the same pitch in the embodiment of FIG. 5. In an alternative embodiment, the pitches between two adjacent pads may be different from one another. The interconnect power/ground pads (e.g., the interconnect power/ground pads 1121b) may be arranged in an array on an inboard area of the bonding surface of the semiconductor device 110.

With now reference to FIG. 6, a layout of the device top metallization structure 122 on the flexible substrate 120 corresponding to the layout of the interconnect contacts 1121 on the semiconductor device 110 of FIG. 5 is shown by way of example in a plan view in FIG. 6. In accordance with some embodiments of the disclosure, the device top metallization structure 122 may include a plurality of signal pads 1222a and a plurality of power pads (and/or ground pads) 1222b arranged on the flexible substrate 120 in an array complementary to the layout of the interconnect contacts 1121 on the semiconductor device 110 shown in FIG. 5. Thereby, the signal pads 1222a and the power pads (and/or ground pads) 1222b can receive and be bonded respectively to the conductive bumps (signal, power and/or ground bumps, etc.) 115 attached to the corresponding pads (e.g. the interconnect signal pads 1121a and the interconnect power pads 1121*b*) on the semiconductor device 110. In this arrangement according to the disclosure, all the pads (e.g. the signal pads 1222*a* and the power/ground pads 1222*b*) on the flexible substrate 120 associated with device signal lines and device power lines (e.g., 1221*a*, 1221*b*) may be in an orthogonal array of multiple rows at the perimeter of the array. However, the disclosure is not limited thereto.

In accordance with some embodiments of the disclosure, the device top metallization structure 122 may further includes a plurality of device signal lines (e.g., device signal lines 1221*a*) and a plurality of device power lines (e.g., device power lines 1221*b*) extended beyond the device bonding region R1. In some embodiments, the device signal lines 1221*a* connect the signal pads 1222*a* respectively and extends beyond the device bonding region R1. In some embodiments, the device power lines 1221*b* connect the power pads 1222*b* respectively and may extend beyond the device bonding region R1. That is to say, the device signal lines 1221*a* and the device power lines 1221*b* connected to the corresponding signal pads 1222*a* and power pads 1222*b* can directly cross beneath the outer edge (illustrated as the dotted line shown in FIG. 6) of the semiconductor device 110 in the uppermost metal layer of the flexible substrate 120. In some embodiments, the signal pads 1222*a* and the power pads 1222*b* on the flexible substrate 120 may be connected to deeper metal layers in the flexible substrate 120 by way of short traces and vias. For example, the power pads 1222*b* may be connected by way of short traces (power "stubs" or "jogs") (e.g., the device power lines 1221*b*) through power vias to power traces in a metal layer beneath. Similarly, and the ground pads of the device top metallization structure 122 may be connected by way of short traces (ground "stubs" or "jogs") (e.g., the device ground lines of the device top metallization structure 122) through ground vias to power traces in a metal layer beneath.

In some embodiments, some of the interconnect contacts 1121 including the interconnect signal pads 1121*a* and the interconnect power pads 1121*b* are electrically connected to one another through the corresponding device signal lines 1221*a* and device power lines 1221*b* of the device top metallization structure 122. In some of the embodiments, since the topmost metallization structure (top metal) of the semiconductor device 110 for connecting the interconnect contacts 1121 is omitted, such metallization structure for connecting the interconnect contacts 1121 is then routed on the flexible substrate 120. That is to say, some of the interconnect contacts 1121 may be connected to one another (i.e., some of the interconnect contacts 1121 are combined together) through the device top metallization structure 122 on the top surface of the flexible substrate 120.

In accordance with some embodiments of the disclosure, one of the device power lines 1221*b* connects at least two of the interconnect contacts 1121 on the semiconductor device 110. In detail, one of the device power lines 1221*b* may connect the interconnect power pads 1121*b* of the interconnect contacts 1121 on the semiconductor device 110 through the power pads 1222*b* of the device top metallization structure 122 on the flexible substrate 120 and the corresponding conductive bumps 115. However, the embodiment shown in FIG. 6 is merely for illustration, disclosure does not exclude other forms of connecting the interconnect power pads 1121*b* on the semiconductor device 110 by way of the device power lines 1221*b* on the flexible substrate 120.

In accordance with some embodiments of the disclosure, one of the device signal lines 1221*a* connects at least two of the interconnect contacts 1121 on the semiconductor device 110. In detail, one of the device signal lines 1221*a* may connect at least two the interconnect signal pads 1121*a* of the interconnect contacts 1121 on the semiconductor device 110 through the signal pads 1222*a* of the device top metallization structure 122 on the flexible substrate 120 and the corresponding conductive bumps 115. In some embodiments, one of the device signal lines 1221*a* may include a diverging portion L1 and a main portion L2 connected to one another. In some embodiments, the diverging portion L1 is connected to at least two of the interconnect contacts 1121 (e.g. the interconnect signal pads 1121*a*) respectively and connected to the main portion L1, and the main portion L2 is extended beyond the device bonding region R1. In the present embodiments, the diverging portion L1 may diverge from the main portion L2 to connect, for example, two different interconnect signal pads 1121*a* through the corresponding conductive bumps 115 and the corresponding signal pads 1222*a*, so as to combine two interconnect contacts 1121 into one for further external connection.

In accordance with some embodiments of the disclosure, the device signal lines 1221*a* in the embodiment of FIG. 6 are routed for connecting the signal pads 1222*a* and passing away from the die (semiconductor device 110) footprint (i.e., the device bonding region R1). In the embodiment of FIG. 6, the device power lines (and/or device ground lines) 1221*b* may connect the power pads 1222*b* and be routed to vias beneath the die footprint. In some embodiments, the device signal lines 1221*a* can all be routed in a single upper metal layer (e.g., the device top metallization structure 122) on the flexible substrate 120. Accordingly, no stubs or vias are required in the signal path, and parasitics in signal transmission may be avoided. However, the embodiment shown in FIG. 6 is merely for illustration, the disclosure does not exclude other forms of connecting the interconnect signal pads 1121*a* on the semiconductor device 110 by way of the device signal lines 1221*a* on the flexible substrate 120. Similarly, the disclosure does not exclude other forms of connecting the interconnect power pads 1121*b* on the semiconductor device 110 by way of the device power lines 1221*b* on the flexible substrate 120.

In some embodiments, the device signal lines 1221*a* can be made as close together as available techniques for trace formation allow, although as is well known if they are made too close signal interference may occur in adjacent lines. The signal pads 1222*a* may be made as close together as available techniques for trace formation and bump bonding allow. The foregoing examples illustrate embodiments in which no interconnect power pads 1121*b* are located among the interconnect signal pads 1121*a* nearest the perimeter of the semiconductor device 110 (and device bonding region R1 on the flexible substrate 120). Similarly, no interconnect signal pads 1121*a* are located among the interconnect power pads 1121*b* well within the core array about the middle of the semiconductor device 110. In some circumstances, it may be desirable to locate one or a few interconnect signal pads 1121*a* within the core array (usually, but not limited to, adjacent to interconnect ground pads). Accordingly, one or a few device signal lines 1221*a* may be routed in the flexible substrate 120 to vias beneath the device bonding region R1 to connect with a lower metal layer in the flexible substrate 120. In an alternative embodiment, one or a few device signal lines 1221*a* may be routed in the device top metallization structure 122 of the flexible substrate 120 from well within the device bonding region R1, and extended outward under the outer edge of the semiconductor device 110.

In addition, in some circumstances, it may be desirable to locate one or a few interconnect power pads 1121*b* or one or a few interconnect ground pads more peripherally, among the interconnect signal pads 1121a near the perimeter of the semiconductor device 110 and, accordingly, near the perimeter of the device bonding region R1 on the flexible substrate 120. The disclosure does not limit the layout of the interconnecting metallization structure 112 on the semiconductor device 110 and the device top metallization structure 122 on the flexible substrate 120 as long as the top metal of the semiconductor device 110 is omitted and is routed on the flexible substrate 120 instead. With such configuration, the production cost and overall thickness of the semiconductor device 110 can be reduced.

Figure 7:
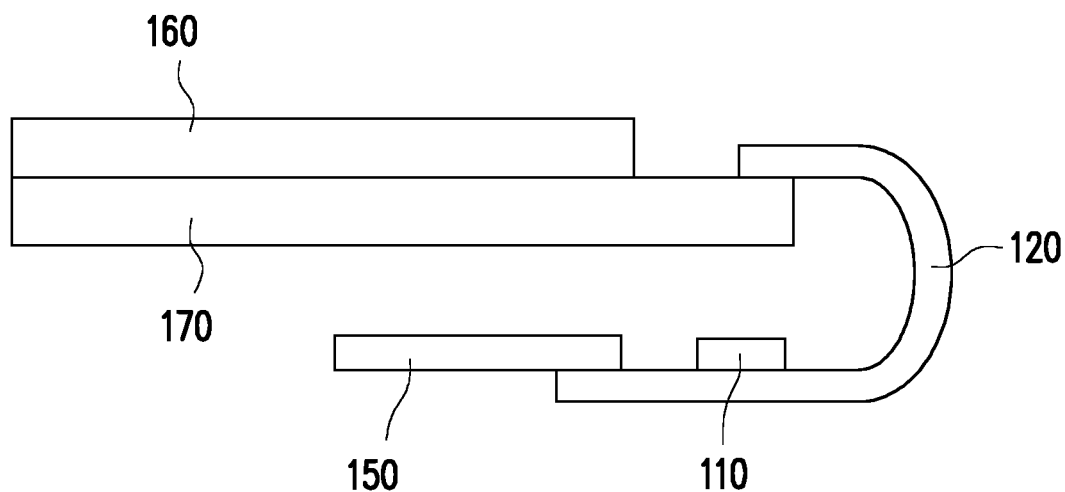
FIG. 7 illustrates a schematic view of a display apparatus according to some exemplary embodiments of the present disclosure.

FIG. 7 illustrates a schematic view of a display apparatus according to some exemplary embodiments of the present disclosure. With now reference to FIG. 4 and FIG. 7, in some embodiments, the semiconductor package 100 described above may be applicable to a display apparatus 10 shown in FIG. 7. In accordance with some embodiments of the disclosure, the display apparatus 10 includes a display panel 160, a flexible printed circuit (FPC) board 150 and the semiconductor package 100, which includes the semiconductor device 110, the flexible substrate 120 and the conductive bumps 115. In some embodiments, the flexible substrate 120 is configured to connect the display panel 140 to the flexible printed circuit board 150.

In accordance with some embodiments of the disclosure, the display panel 160 is connected to the flexible substrate 120 and electrically connected to the device top metallization structure 122. In some embodiments, the display panel 160 may be disposed on a glass substrate 170. The display panel 160 may include a plurality of gate lines extend in a first direction, for example horizontally, to a gate area, and a plurality of data lines extend in a second direction, for example vertically, to a data area. It will be understood that these directions may be reversed. In some embodiments, the gate lines and the data lines intersect each other, preferably orthogonally. A plurality of gate pads and data input pads are formed at respective ends of the gate lines and the data lines. Signals are input to the gate input pads and the data input pads.

In some embodiments, the flexible substrate 120 may be a tape package carrier that includes two opposing end portions that attach to the display panel 160 (via the glass substrate 170) and to the flexible printed circuit board 150, respectively. The device top metallization structure 122 on the flexible substrate 120 is configured to transmit electrical signals therethrough. In some of the embodiments, the semiconductor package 10 may be a chip on film (COF) package. In some embodiments, the semiconductor device 110 may include a driver IC for driving the display panel 160. That is to say, the semiconductor device 110 is configured as a driving integrated circuit, which is electrically connected to device top metallization structure 122 of the flexible substrate 120 to thereby drive the display panel 160. In the present embodiments, the flexible printed circuit board 150 is connected to the flexible substrate 120 and electrically connected to the semiconductor device 110 through the flexible substrate 120. In some embodiments, the flexible substrate 120 may further include a plurality of conductive leads electrically connected to the device top metallization structure 122. In some embodiments, the conductive leads generally include common signal lines through which common signals are transmitted to the display panel 140 and to the flexible printed circuit board 150. In some embodiments, Input/output leads respectively are also generally included, through which image signals are output from the flexible printed circuit board 150 and input into the display panel 160.

Figure 8:
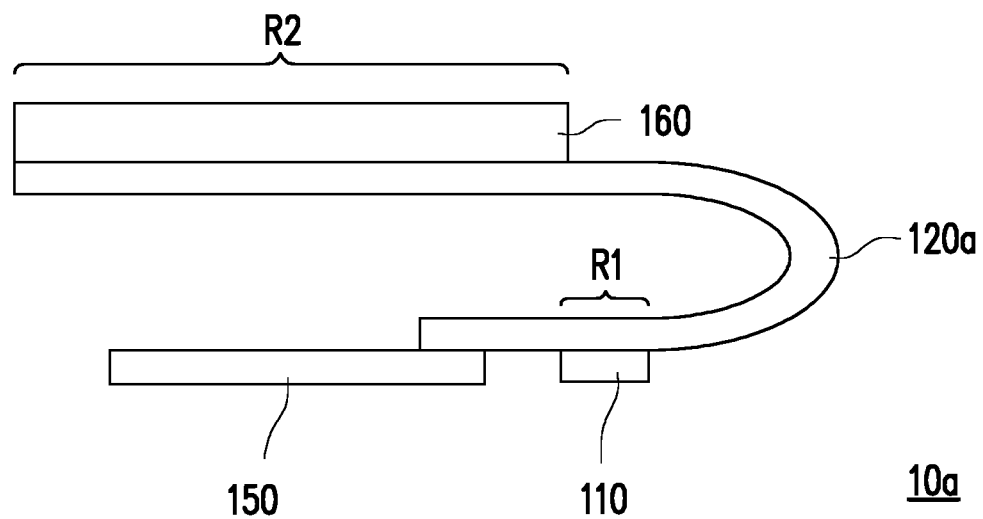
FIG. 8 illustrates a schematic view of a display apparatus according to some exemplary embodiments of the present disclosure.

FIG. 8 illustrates a schematic view of a display apparatus according to some exemplary embodiments of the present disclosure. It is noted that the display apparatus 10a shown in FIG. 8 contains many features same as or similar to the display apparatus 10 disclosed earlier with FIG. 7. For purpose of clarity and simplicity, detail description of same or similar features may be omitted, and the same or similar reference numbers denote the same or like components. The main differences between the display apparatus 10a shown in FIG. 8 and the display apparatus 10 shown in FIG. 7 are described as follows.

With now reference to FIG. 4 and FIG. 8, in some embodiments, the semiconductor package 100 described earlier may also be applicable to a display apparatus 10 shown in FIG. 8. In accordance with some embodiments of the disclosure, the display apparatus 10 includes a display panel 160, a flexible printed circuit (FPC) board 150 and the semiconductor package 100, which includes the semiconductor device 110, the flexible substrate 120a and the conductive bumps 115. In some embodiments, the flexible substrate 120a is configured to connect the display panel 140 to the flexible printed circuit board 150. In the present embodiment, the flexible printed circuit board 150 is connected to the flexible substrate 120a, and the display panel 160 is disposed on the flexible substrate 120a.

In accordance with some embodiments of the disclosure, the display panel 160 is formed on an active area R2 of the flexible substrate 120a while the semiconductor device 110 is bonded on the device bonding region R1 of the flexible substrate 120a for driving the display panel 160. In some embodiments, the flexible substrate 120a may be a transparent flexible substrate having a top surface and a bottom surface opposite to each other, which can be selected from one of the group consisting of Polyethylene terephthalate (PET), Poly(methyl methacrylate (PMMA), Polyimide (PI), Polycarbonate (PC) and glass or combination thereof. The disclosure is not limited thereto. In some of the embodiments, the semiconductor package 10a may be a chip on plastic (COP) package.

Based on the above discussions, it can be seen that the present disclosure offers various advantages. It is understood, however, that not all advantages are necessarily discussed herein, and other embodiments may offer different advantages, and that no particular advantage is required for all embodiments.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In accordance with some embodiments of the disclosure, a semiconductor package includes a flexible substrate and a semiconductor device. The flexible substrate includes a device bonding region and a device top metallization structure including a plurality of device signal lines and a plurality of device power lines extended beyond the device bonding region. The semiconductor device is disposed on the device bonding region and includes an interconnecting metallization structure and a passivation layer covering the interconnecting metallization structure and revealing a plurality of interconnect contacts of the interconnecting metallization structure, wherein the plurality of interconnect contacts electrically connected to one another through the device top metallization structure.

In accordance with some embodiments of the disclosure, a display apparatus includes a flexible substrate, a display panel, a semiconductor device, and a plurality of conductive bumps. The flexible substrate includes a device bonding region and a device top metallization structure disposed on the device bonding region and extended beyond the device bonding region. The display panel is connected to the flexible substrate and electrically connected to the device top metallization structure. The semiconductor device is disposed on the device bonding region and includes an interconnecting metallization structure and a passivation layer covering the interconnecting metallization structure and revealing a plurality of interconnect contacts of the interconnecting metallization structure. The conductive bumps are in contact with the plurality of interconnect contacts respectively and connected to the device top metallization structure, wherein the plurality of conductive bumps are connected to one another through the device top metallization structure.

In accordance with some embodiments of the disclosure, a manufacturing method of a semiconductor package includes the following steps. A semiconductor device is provided, wherein providing the semiconductor device includes the following steps: forming an interconnecting metallization structure on a semiconductor substrate, wherein the interconnecting metallization structure comprises a plurality of interconnect contacts; and forming a passivation layer on the interconnecting metallization structure, wherein the passivation layer reveals the plurality of interconnect contacts. The semiconductor device is bonded on a device bonding region of a flexible substrate, wherein the flexible substrate includes a device top metallization structure disposed on the device bonding region and extended beyond the device bonding region, and the plurality of interconnect contacts are electrically connected to one another through the device top metallization structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
   a flexible substrate comprising a device bonding region and a device top metallization structure comprising a plurality of device signal lines and a plurality of device power lines extended beyond the device bonding region; and
   a semiconductor device disposed on the device bonding region and comprising an interconnecting metallization structure and a passivation layer covering the interconnecting metallization structure and revealing a plurality of interconnect contacts of the interconnecting metallization structure, wherein the plurality of interconnect contacts electrically connected to one another through the device top metallization structure.

2. The semiconductor package as claimed in claim 1, wherein one of the plurality of device power lines connects at least two of the plurality of interconnect contacts.

3. The semiconductor package as claimed in claim 1, wherein the plurality of interconnect contacts comprises a plurality of interconnect signal pads electrically connected to one another through at least one of the device signal lines and a plurality of interconnect power pads electrically connected to one another through at least one of the device power lines.

4. The semiconductor package as claimed in claim 1, wherein one of the plurality of device signal lines connects at least two of the plurality of interconnect contacts.

5. The semiconductor package as claimed in claim 1, wherein one of the plurality of device signal lines comprises a diverging portion and a main portion extended beyond the device bonding region, and the diverging portions connected to at least two of the plurality of interconnect contacts respectively and connected to the main portion.

6. The semiconductor package as claimed in claim 1, further comprising a plurality of conductive bumps in contact with the plurality of interconnect contacts and connected to the device top metallization structure.

7. The semiconductor package as claimed in claim 1, wherein the semiconductor device is free of power lines and signal lines that are configured to electrically connect the plurality of interconnect contacts to one another.

8. The semiconductor package as claimed in claim 1, wherein the flexible substrate further comprises a protection layer partially covering the device top metallization structure and revealing the device bonding region.

9. A display apparatus, comprising:
   a flexible substrate comprising a device bonding region and a device top metallization structure disposed on the device bonding region and extended beyond the device bonding region;
   a display panel connected to the flexible substrate and electrically connected to the device top metallization structure;
   a semiconductor device disposed on the device bonding region and comprising an interconnecting metallization structure and a passivation layer covering the interconnecting metallization structure and revealing a plurality of interconnect contacts of the interconnecting metallization structure; and
   a plurality of conductive bumps in contact with the plurality of interconnect contacts respectively and connected to the device top metallization structure, wherein the plurality of conductive bumps are connected to one another through the device top metallization structure.

10. The display apparatus as claimed in claim 9, wherein the device top metallization structure comprises a plurality of device signal lines and a plurality of device power lines connected between the plurality of conductive bumps and extended beyond the device bonding region.

11. The display apparatus as claimed in claim 9, wherein the device top metallization structure is connected to at least two of the plurality of interconnect contacts through the corresponding conductive bumps.

12. The display apparatus as claimed in claim 9, wherein the device top metallization structure comprises a diverging portion and a main portion extended beyond the device bonding region, and the diverging portions connected to at least two of the plurality of interconnect contacts respectively and connected to the main portion.

13. The display apparatus as claimed in claim 9, wherein the semiconductor device comprises a driver IC for driving the display panel.

14. The display apparatus as claimed in claim 9, further comprising a flexible printed circuit (FPC) board connected to the flexible substrate and electrically connected to the semiconductor device.

15. The display apparatus as claimed in claim 9, further comprising a FPC board connected to the flexible substrate, wherein the display panel is disposed on the flexible substrate.

16. The display apparatus as claimed in claim 9, wherein the material of the flexible substrate further comprises polyimide.

17. The display apparatus as claimed in claim 9, wherein the flexible substrate further comprises a protection layer partially covering the device top metallization structure and revealing the device bonding region.

18. A manufacturing method of a semiconductor package, comprising:
   providing a semiconductor device, wherein providing the semiconductor device comprises:
      forming an interconnecting metallization structure on a semiconductor substrate, wherein the interconnecting metallization structure comprises a plurality of interconnect contacts; and
      forming a passivation layer on the interconnecting metallization structure, wherein the passivation layer reveals the plurality of interconnect contacts; and
   bonding the semiconductor device on a device bonding region of a flexible substrate, wherein the flexible substrate comprises a device top metallization structure disposed on the device bonding region and extended beyond the device bonding region, and the plurality of interconnect contacts are electrically connected to one another through the device top metallization structure.

19. The manufacturing method of the semiconductor package as claimed in claim 18, further comprising:
   bonding the semiconductor device on the device bonding region of the flexible substrate comprises forming a plurality of conductive bumps on the plurality of interconnect contacts respectively, wherein the plurality of conductive bumps are bonded to the device top metallization structure.

20. The manufacturing method of the semiconductor package as claimed in claim 18, further comprising:
   forming a protection layer on the flexible substrate, wherein the protection layer partially covers the device top metallization structure and reveals the device bonding region.

* * * * *